United States Patent [19]
Yamamoto et al.

[11] Patent Number: 6,108,050
[45] Date of Patent: Aug. 22, 2000

[54] TELEVISION TUNER

[75] Inventors: Masaki Yamamoto; Masashi Suzuki; Yasuharu Kudo; Takeshi Shimizu; Takeo Suzuki, all of Fukushima-ken, Japan

[73] Assignee: Alps Electric Co., Ltd., Tokyo, Japan

[21] Appl. No.: 08/906,040

[22] Filed: Aug. 5, 1997

[30] Foreign Application Priority Data

Aug. 9, 1996 [JP] Japan ................................ 8-227862

[51] Int. Cl.⁷ .................. H04B 1/26; H04B 1/16; H04N 5/48
[52] U.S. Cl. .................. 348/731; 348/732; 348/733; 345/180.2; 345/180.4; 345/188.2; 345/191.1
[58] Field of Search .................. 348/725, 726, 348/731, 732, 733; 455/302, 315, 339, 180, 181, 188, 189, 191, 197, 340; 315/364

[56] References Cited

U.S. PATENT DOCUMENTS

| | | | |
|---|---|---|---|
| 4,189,678 | 2/1980 | Sakamoto | 325/429 |
| 4,247,953 | 1/1981 | Shinagawa | 455/191 |
| 4,303,944 | 12/1981 | Kitamura | 358/191.1 |
| 4,326,295 | 4/1982 | Matsumoto et al. | 455/182 |
| 4,418,427 | 11/1983 | Muterspaugh | 455/180 |
| 4,418,428 | 11/1983 | Evans | 455/180 |
| 4,691,378 | 9/1987 | Kumamoto | 455/301 |
| 5,089,754 | 2/1992 | George | 315/386 |
| 5,208,517 | 5/1993 | Beppu | 315/364 |
| 5,214,399 | 5/1993 | Hohmann | 334/1 |
| 5,428,828 | 6/1995 | Pugel | 455/191.2 |
| 5,786,668 | 7/1998 | Lim | 315/85 |

*Primary Examiner*—Mark R. Powell
*Assistant Examiner*—Wesner Sajous
*Attorney, Agent, or Firm*—Brinks Hofer Gilson & Lione

[57] ABSTRACT

Band characteristics between reception bands or reception channels are uniformed. There is provided a television tuner comprising a first tuning circuit which can be tuned to a television channel frequency in a first frequency band, a first amplification circuit for amplifying an output signal from the first tuning circuit, a second tuning circuit which can be tuned to a television channel frequency in a second frequency band, and a second amplification circuit for amplifying an output signal from the second tuning circuit, wherein, to at least one of the first and second tuning circuits, a damper resistor for decreasing Q of the tuning circuit when the tuning circuit is tuned to a frequency in a low-frequency band including each lowest channel in the first or second frequency band is connected.

4 Claims, 5 Drawing Sheets

TELEVISION TUNER

BACKGROUND OF THE INVENTION

1. Field of the Invention

The present invention relates to a tuner for a television set.

2. Description of the Related Art

In a television tuner, the frequency of a desired channel of a received television signal is amplified through a tuning circuit. In this tuning circuit, a varactor diode is used. Since a range of a change in capacitor of the varactor diode is limited to a specific range, especially, a so-called band switching type tuning circuit is used in a VHF band which covers a wide frequency range from 50 MHz to 300 or 400 MHz is used. The tuning circuit is designed to be tuned to the frequency of a reception channel in each band such as a high band, a middle band, or a low band by switching the tuning circuit.

A conventional television tuner will be described below with reference to FIGS. 3 and 4. FIG. 3 shows a part of the conventional television tuner, and FIG. 4 is a format of channel-selection data for controlling an operation of the tuner shown in FIG. 3. Referring to FIG. 3, a television signal from an antenna (not shown) or a cable television signal is input to an input terminal 1 through a cable. The frequency range of the television signals is set to be a range from 500 MHz to 800 MHz in the U.S.A. The television signal input to the input terminal 1 is distributed by two. One television signal is input to a VHF receiver 2, and the other is input a UHF receiver 3. The VHF receiver 2 is constituted by a trap circuit 4 for attenuating a television intermediate frequency (IF frequency) band, a VHF tuning circuit 5, and a VHF amplification circuit 6, and the UHF receiver 3 is constituted by a UHF tuning circuit 7 and a UHF amplification circuit 8.

The television signal input to the VHF receiver 2 is amplified by the VHF amplification circuit 6 after a desired channel frequency is selected by the VHF tuning circuit 5, and then guided to a VHF mixing circuit or the like of a following stage (not shown). The other television signal of the television signals distributed by two is amplified by the UHF amplification circuit 8 after a desired channel frequency is selected by the UHF tuning circuit 7 of the UHF receiver 3 in the same manner as described above, and then guided to a UHF mixing circuit or the like of a following stage (not shown).

The operation of the VHF receiver 2 and the operation of the UHF receiver 3 are controlled by a channel-selection control circuit 11 on the basis of channel-selection data (data for specifying a selected channel) from a channel selector of a television set (not shown). More specifically, when a channel in the VHF band is selected, the channel-selection control circuit 11 supplies a power supply voltage to the VHF amplification circuit 6 to stop the supply of a power supply voltage to the UHF amplification circuit 8. On the other hand, when a channel in the UHF band is selected, a power supply voltage is supplied to the UHF amplification circuit 8 in the same manner as described above to stop the supply of a power supply voltage to the VHF amplification circuit 6. The channel-selection control circuit 11 supplies a tuning voltage to the VHF tuning circuit 5 and the UHF tuning circuit 7.

In addition, when a channel in the VHF band is selected, the VHF tuning circuit 5 is switched by the channel-selection control circuit 11 in such a manner that, depending on whether the selected channel belongs a high band or a low band, the VHF tuning circuit 5 is properly tuned to a channel frequency in these bands. In the prior art shown in FIG. 3, a 2-band-switching type tuning circuit in which a low band ranging from about 50 MHz to 130 MHz and a high band ranging from 130 MHz to 360 MHz are switched to each other by the channel-selection control circuit 11 is constituted.

In the channel-selection control circuit 11, for example, a PLLIC (integrated circuit) for television synthesizer is used. Channel-selection data from a channel selector of a television set (not shown) is input to a data input terminal SDA, and a clock signal is input to a clock input terminal CL. In addition, a voltage of 5 V for operating the channel-selection control circuit 11 is supplied to a power supply terminal VC1, and a voltage of 12 V used as the power supply voltages of the VHF amplification circuit 6 and the UHF amplification circuit 8 and also used as a control voltage for band switching in the VHF tuning circuit 5 is supplied to another power supply terminal VC2.

A format of channel-selection data input to the data input terminal SDA of the channel-selection control circuit 11, as shown in FIG. 4(A), is constituted by band switch data consisting of 4 serial bits and frequency data consisting of 15 serial bits. The band switch data is generally used to identify whether a selected channel belongs a low band or a high band. The frequency data is used to generate a tuning voltage required for tuning the VHF tuning circuit 5 or the UHF tuning circuit 7 to the frequency in the selected channel, and is data for controlling the PLL incorporated in the channel-selection control circuit 11.

For example, when 4-bit band switch data is given by 1, 0, 0, 0 as shown in FIG. 4(B), the 12-V voltage supplied to the power supply terminal VC2 is output to a switch terminal BS4 as a control voltage by the switch circuit (not shown) in the channel-selection control circuit 11. When the band switch data is given by 0, 1, 0, 0 as shown in FIG. 4(C), the voltage is output to a switch terminal BS3. When the band switch data is given by 0, 0, 1, 0 as shown in FIG. 4(D), the voltage is output to a switch terminal BS2. When the band switch data is given by 0, 0, 0, 1 as shown in FIG. 4(E), the voltage is output to a switch terminal BS1. In this prior art, in selection of a VHF low-band channel, the band switch data shown in FIG. 4(B) and output from a channel selector of a television set (not shown) is input to the data input terminal SDA; in selection of a VHF high-band channel, the band switch data shown in FIG. 4(C) is input to the data input terminal SDA; and in selection of a UHF channel, the band switch data shown in FIG. 4(D) is input to the data input terminal SDA.

The 12-V voltage supplied to the power supply terminal VC2 corresponds to a band to which the selected channel belongs. That is, the 12-V voltage is output to the switch terminal BS4 in selection of a low-band channel; the 12-V voltage is output to the switch terminal BS3 in selection of a high-band channel; and the 12-V voltage is output to the switch terminal BS2 in selection of a UHF-band channel. A tuning voltage corresponding to the selected channel is output to a terminal VT. In this prior art, since the VHF band has a two-band configuration constituted by two low and high bands, the two VHF bands and one UHF band constitute a three-band configuration. The switch terminal BS1 is not used to be an idle terminal.

The VHF tuning circuit 5 is basically constituted by varactor diodes 12 and 13 serving as tuning capacitors, tuning coils 14, 15, 16, and 17, and switch diodes 18 and 19. When a low-band channel is selected, the switch diodes 18 and 19 are reversely biased by a 12-V control voltage from the switch terminal BS4 of the channel-selection control circuit 11 to be rendered non-conductive, and a low-band tuning circuit is constituted by the three series tuning coils 14, 17, and 16 and the two varactor diodes 12 and 13. In this case, an impedance on an antenna side (to be referred to as a signal source hereinafter) is stepped up by a rate of the tuning coil 14 to the sum of the tuning coils 16 and 17, and is matched to the impedance of the VHF amplification circuit 6.

When a high-band channel is selected, the switch diodes 18 and 19 are forward-biased by a control voltage from the switch terminal BS3 of the channel-selection control circuit 11 to be rendered conductive, the tuning coils 14 and 15 are connected in parallel, and both the ends of the tuning coil 17 are short-circuited. The tuning coil 16 is connected in series with the tuning coils 14 and 15 connected in parallel, thereby constituting a high-band tuning circuit. The impedance of a signal source is stepped up by a rate of the coils 14 and 15 connected in parallel to the coil 16 to be matched to the impedance of the VHF amplification circuit 6.

In this manner, in the conventional VHF tuning circuit 5, the tuning coils 14 and 16 of the tuning coils 14, 15, 16, and 17 are commonly used in reception of a low-band signal and reception of a high-band signal, and determine a tuning frequency in a high band and a tuning frequency in a low band while interlocking with the varactor diodes 12 and 13. The impedance of the signal source is stepped up by a so-called L tap to be matched to the impedance of the VHF amplification circuit 6. On the other hand, the UHF tuning circuit 7 is constituted by a tuning coil 20 and a varactor diode 21 but does not constitute an L tap because the impedance of the UHF amplification circuit 8 in a UHF band is low so as to be matched to the impedance of the signal source without changing the impedance.

In reception of a low-band VHF signal or a high-band VHF signal, 12-V control voltages from the switch terminals BS4 and BS3 of the channel-selection control circuit 11 are supplied to the VHF amplification circuit 6 as power supply voltages through other switch diodes 22 and 23. Similarly, in reception of a UHF signal, the control voltage from the switch terminal BS2 of the channel-selection control circuit 11 is supplied to the UHF amplification circuit 8 as a power supply voltage to the UHF amplification circuit 8. A tuning voltage is applied from the tuning voltage terminal VT of the channel-selection control circuit 11 to the varactor diodes 12 and 13 of the VHF tuning circuit 5 and the varactor diode 21 of the UHF tuning circuit 7. Note that the tuning voltage is output from the tuning voltage terminal VT in such a manner that an external voltage (e.g., 33 V) applied from an external terminal VB to the terminal VT of the channel-selection control circuit 11 through a resistor 24 is controlled by the PLL circuit in the channel-selection control circuit 11.

As described above, as a conventional VHF tuning circuit, a band switching type tuning circuit is used to be tuned to a wide frequency band in the VHF band. In addition, in order to match the impedance of a signal source to the impedance of a VHF amplification circuit, the impedance of the signal source is stepped up by a tuning coil, and, at this time, some of the tuning coils is commonly used in a high band and a low band. For this reason, it is difficult to set a tuning coil which makes setting of the tuning frequency and matching of impedances compatible with each other in both the high band and the low band. A band switching operation is performed by switching some of the tuning coils by rendering a switch diode conductive or non-conductive. For this reason, a residual capacitance of the switch diode in a non-conductive state is connected to the tuning coil, and the following problem is posed. That is, an equivalent inductance including the residual capacitance changes depending on a frequency to offset both the tuning frequency and the impedance from set values.

The impedance generally increases as the frequency of an amplification circuit due to the characteristics of an amplification element such as an FET used in the amplification circuit. For this reason, Q of the tuning circuit constituted in a low-band state is higher than Q of the tuning circuit constituted in a high-band state, and Q of the tuning circuit increases as the frequency in the same band. For this reason, the frequency response characteristics (input-output characteristics to frequency) of the tuning circuit considerably change between bands and in a band in the entire VHF band. As a result, in a conventional television tuner, as indicated by solid lines in FIGS. 5(A) to 5(F), frequency characteristics are considerably changed depending on the change in tuning frequency even in the same band. More specifically, band widths at F0=100 MHz and F0=50 MHz are smaller than that at F0=130 MHz in low band, and band widths at F0=140 MHz and F0=250 MHz are smaller than that at F0=360 MHz in a high band. Although it is not apparent from FIG. 5, the band width in a low band is smaller than that in a high band.

Therefore, the frequency characteristics of the amplitude of a video output from a television set is degraded to adverse affect image quality. In addition, phase characteristics and delay characteristics in the band of a reception channel may be degraded, and the television set does not easily cope with digitalization of a television system in the future. This invention has as its object to make it easy to perform setting of the tuning frequency and matching between impedances in respective reception bands and to correct the band width which becomes small between reception bands or between reception channels in the same band to make the frequency characteristics uniform.

SUMMARY OF THE INVENTION

In order to achieve the above object, according to the present invention, there is provided a television tuner comprising a first tuning circuit which can be tuned to a television channel frequency in a first frequency band, a first amplification circuit for amplifying an output signal from the first tuning circuit, a second tuning circuit which can be tuned to a television channel frequency in a second frequency band, and a second amplification circuit for amplifying an output signal from the second tuning circuit, wherein, to at least one of the first and second tuning circuits, a damper resistor for decreasing Q of the tuning circuit when the tuning circuit is tuned to a television channel frequency in a predetermined low-frequency band including each lowest channel in the first or second frequency band is connected.

In addition, there is provided a television tuner comprising a channel-selection control circuit which is designed to supply a tuning voltage to the first and second tuning circuits in accordance with a selected channel and generate a control voltage when the first and second tuning circuits are tuned to a frequency in the predetermined low-frequency band, wherein the damper resistor is connected to the tuning circuit through a switch diode, and the switch diode is rendered conductive by the control voltage.

DESCRIPTION OF THE PREFERRED EMBODIMENT

Figure 1:
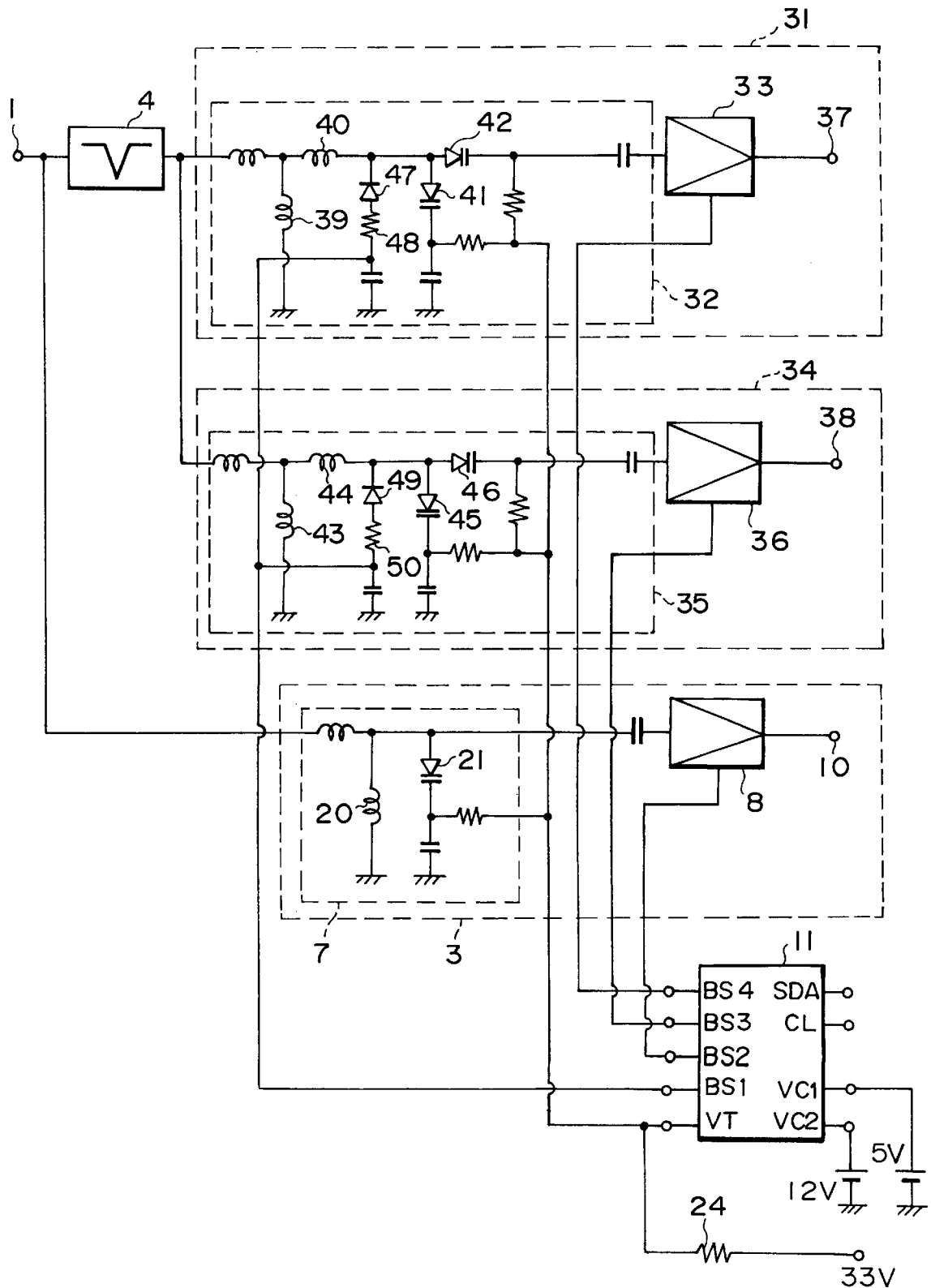
FIG. 1 is a circuit diagram of a television tuner according to the present invention.
Figure 2:
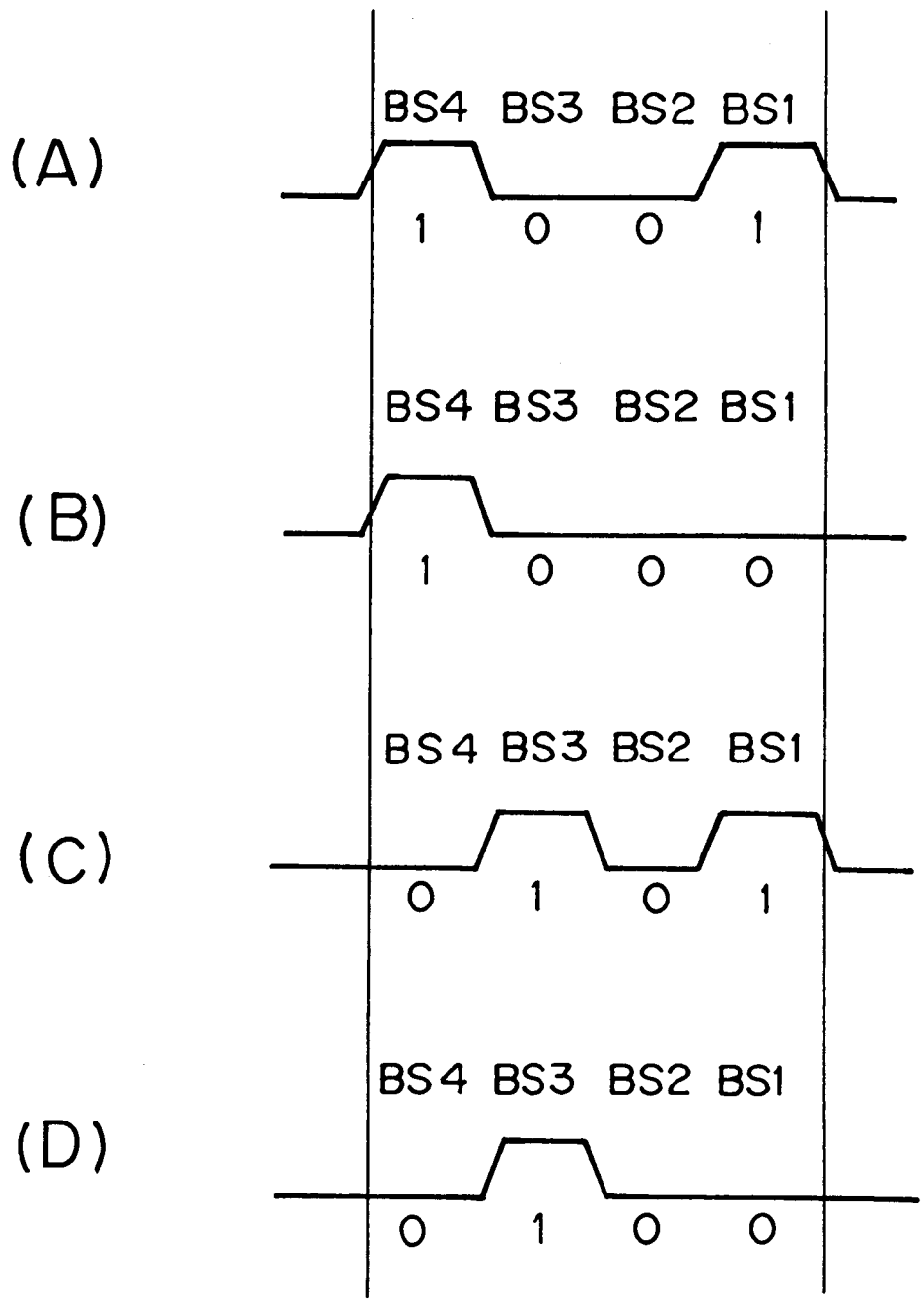
FIG. 2 is a view for explaining channel-selection data of the television tuner according to the present invention.
Figure 3:
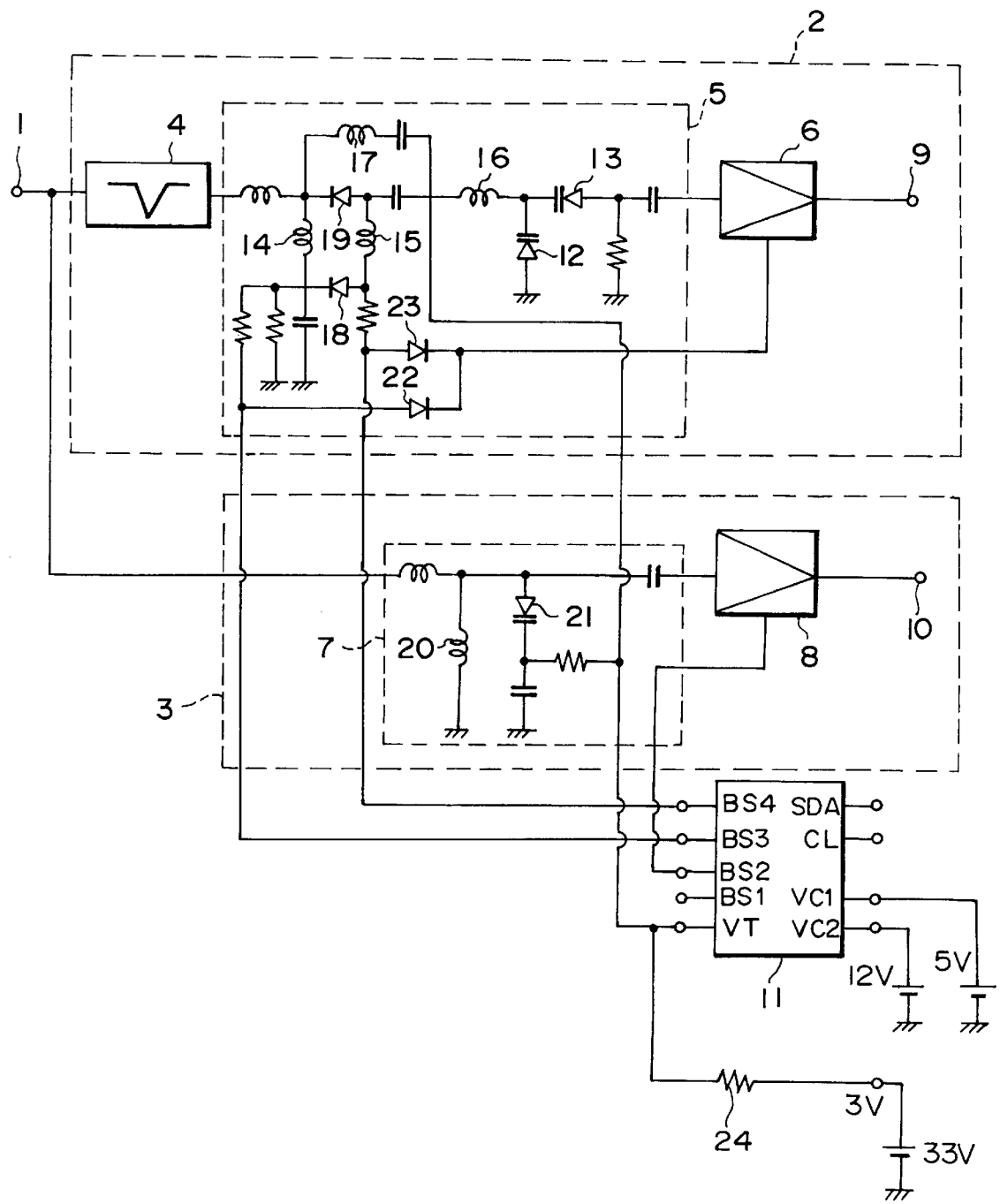
FIG. 3 is a circuit diagram of a conventional television tuner.
Figure 4:
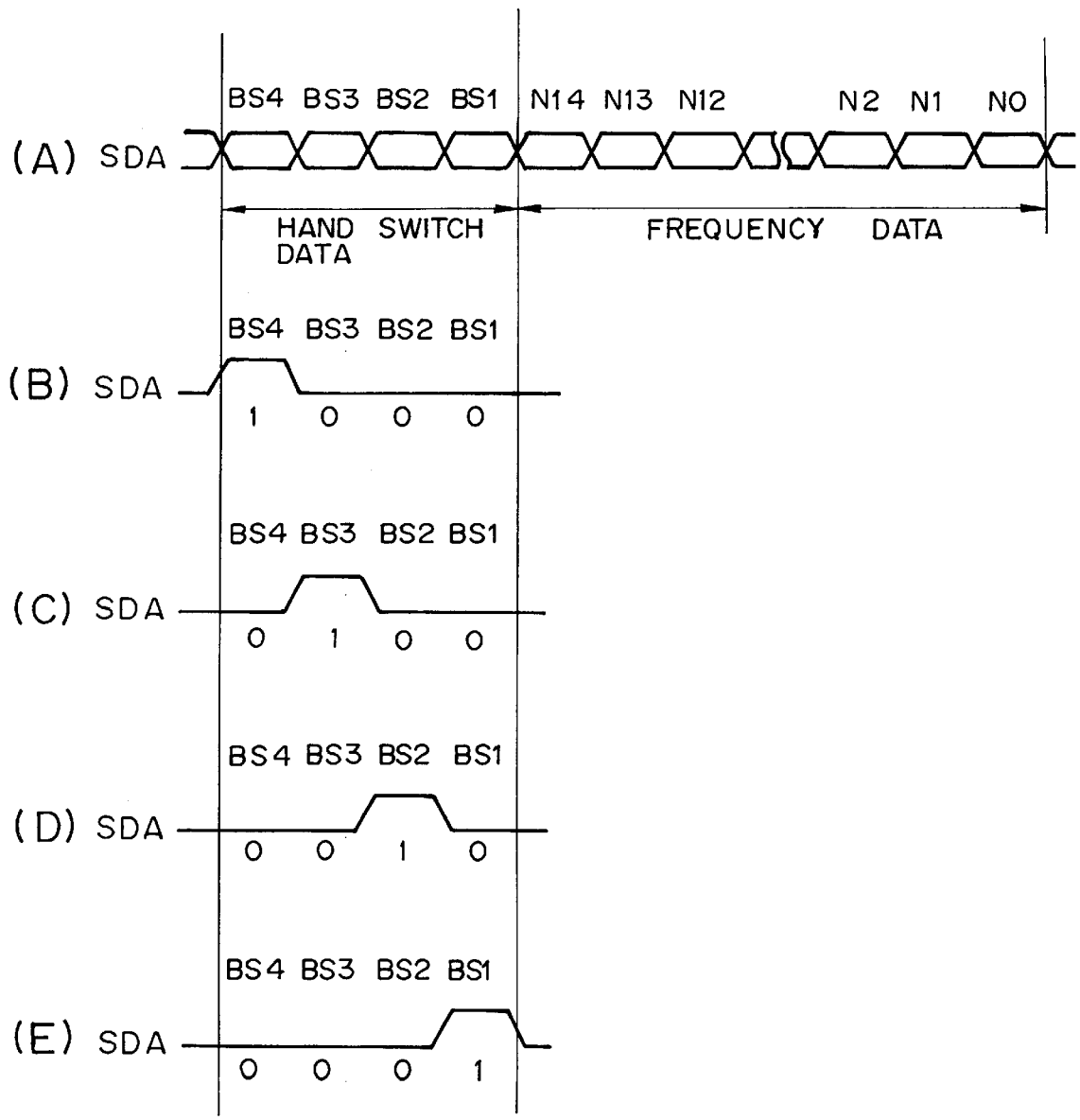
FIG. 4 is a view for explaining channel-selection data of the conventional television tuner.

An embodiment according to the present invention will be described below with reference to FIGS. 1 and 2. FIG. 1 is a circuit diagram of a receiver of a television tuner according to the present invention, and FIG. 2 is a view for explaining channel-selection data of the television tuner according to the present invention. The same reference numerals as in FIG. 3 denote the same parts in FIG. 1, and a description thereof will be omitted. In the television tuner according to the present invention, a tuning circuit in a VHF band is not switched, and tuning circuits and amplification circuits are arranged in a low-band receiver serving as a first receiver and a high-band receiver serving as a second receiver, respectively. Referring to FIG. 1, a low-band receiver 31 receives a low-band channel in a second frequency band, and a high-band receiver 34 receives a high-band channel in a second frequency band. The low-band receiver 31 is constituted by a low-band tuning circuit 32 serving as a first tuning circuit and a low-band amplification circuit 33 serving as a first amplification circuit. The high-band receiver 34 is constituted by a high-band tuning circuit 35 serving as a second tuning circuit and a high-band amplification circuit 36 serving as a second amplification circuit. Outputs from an output terminal 37 of the low-band receiver 31 and an output terminal 38 of the high-band receiver 34 are guided to a VHF mixing circuit or the like of a following stage (not shown).

The low-band tuning circuit 32 is constituted by a parallel tuning circuit comprising two tuning coils 39 and 40 connected in series with each other and varactor diodes 41 and 42 connected in parallel to each other. A signal source is connected to the connection point between the two tuning coils 39 and 40. With this arrangement, the impedance of the signal source is stepped up by the rate of the inductance of the tuning coil 39 and the inductance of the tuning coil 40, so that the impedance can be matched to the impedance of the low-band amplification, circuit 33. On the other hand, the high-band tuning circuit 35 is also constituted by a parallel tuning circuit comprising two tuning coils 43 and 44 connected in series with each other and two varactor diodes 45 and 46 connected in parallel to each other. With this arrangement, the impedance of the signal source is stepped up by the rate of the inductance of the tuning coil 43 to the inductance of the tuning coil 44, so that the impedance can be matched to the impedance of the high-band amplification circuit 36.

In the low-band tuning circuit 32, a series circuit constituted by a switch diode 47 and a damper resistor 48 is connected in parallel to the varactor diode 41. In the high-band tuning circuit 35, a series circuit constituted by a switch diode 49 and a damper resistor 50 is connected in parallel to the varactor diode 45. The switch diodes 47 and 49 are connected to the switch terminal BS1 of the channel-selection control circuit 11 (which is not used in the prior art) through the damper resistors 48 and 50, respectively. The damper resistors 48 and 50 are used to correct Qs of the low-band tuning circuit 32 and the high-band tuning circuit 35, respectively.

Figure 5:
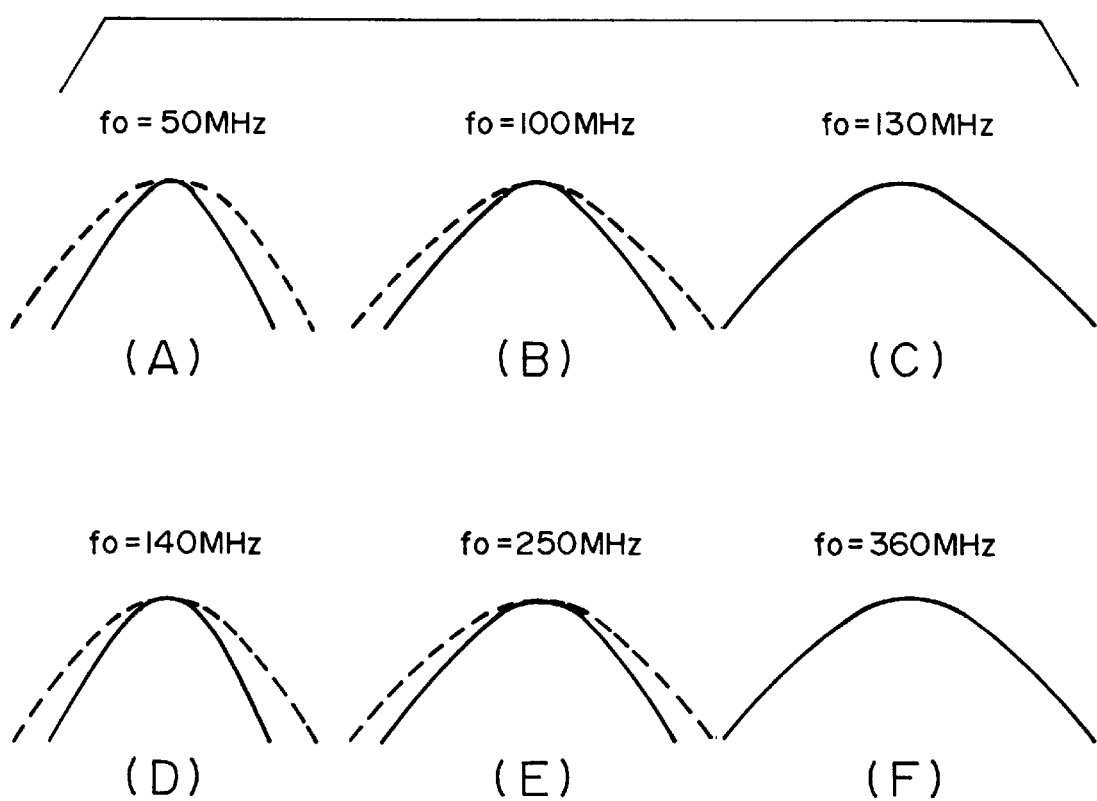
FIG. 5 is a graph of frequency characteristics of a tuning circuit.

For example, when a channel in a low-frequency band ranging from a reception frequency of 50 MHz to a reception frequency of 100 MHz in a low band is received, band switch data indicated by 1, 0, 0, 1 in FIG. 2(A) is input from a channel selector of a television set (not shown) to a data input terminal SDA of the channel-selection control circuit 11. In this manner, a 12-V control voltage is generated by the switch terminal BS1, the voltage renders the switch diode 47 conductive, and the damper resistor 48 is connected in parallel to the low-band tuning circuit 32. Therefore, the low-band tuning circuit 32 is subjected to so-called Q damping in a channel ranging from 50 MHz to 100 MHz, and frequency characteristics indicated by dotted lines in FIGS. 5(A) and 5(B) are obtained so as to be uniformed in the entire low band. When a channel having a frequency over 100 MHz, and the same band switch data as the conventional data shown in FIG. 2(B) is used, a control voltage is not generated by the switch terminal BS1 of the channel-selection control circuit 11. For this reason, the low-band tuning circuit 32 is not Q-damped.

Similarly, when a channel in a low-frequency band ranging from a reception frequency of 140 MHz to a reception frequency of 250 MHz in a high band is received, band switch data indicated by 0, 1, 0, 1 in FIG. 2(C) is input to a data input terminal SDA of the channel-selection control circuit 11. As a result, the high-band tuning circuit 35 is Q-damped in a channel ranging from 140 MHz to 250 MHz, and frequency characteristics indicated by dotted lines in FIGS. 5(D) and 5(E) are obtained so as to be uniformed in the entire high band. When a channel having a frequency over 250 MHz, and the same band switch data as the conventional data shown in FIG. 2(D) is used, the high-band tuning circuit 35 is not Q-damped as in the low channel.

In the above description, although the damper resistors 48 and 50 are arranged in the low-band tuning circuit 32 and the high-band tuning circuit 35, respectively, depending on the degree of frequency characteristics, i.e., the degrees of Qs of the tuning circuits, the damper resistor 48 may be arranged in one of the tuning circuits (e.g., the low-band tuning circuit). When the damper resistors are arranged in both the low-band tuning circuit 32 and the high-band tuning circuit 35, the resistances of the damper resistors 48 and 50 may be properly set in consideration of Qs of the tuning circuits. In addition, when the terminal BS1 is only set to 1 by the format of band switch data from the channel selector, a channel to be Q-damped can be set. This setting can be performed by changing software of the channel selector.

As has been described above, according to the present invention, since the first tuning circuit which can be tuned to a television channel frequency of the first frequency band and the second tuning circuit which can be tuned to a television channel frequency of the second frequency band are independently arranged in the first receiver and the second receiver, respectively, tuning frequencies in the first frequency band and the second frequency band and a tuning coil required for impedance matching can be easily set. Since a damper resistor for decreasing Q of a tuning circuit when the tuning circuit is tuned to a frequency in a predetermined low-frequency band is connected to at least one of the first tuning circuit and the second tuning circuit, band characteristics can be uniformed throughout the entire frequency band between bands or channels, and the video output characteristics of a television set can be made flat to improve image quality. In addition, phase characteristics and delay characteristics in detection of video waves can be improved. Therefore, the present invention can cope with digitalization of a television system in the future.

A control voltage is generated by the channel-selection control circuit when the tuning circuit is tuned to a frequency in the predetermined low-frequency band, and the damper resistor is connected to the tuning circuit through a switch diode. The switch diode is rendered conductive by the control voltage, and the damper resistor is connected to the tuning circuit. For this reason, by only setting channel selection data from the channel selector, the damper resistor can be easily connected to the tuning circuit in accordance with a channel to be Q-damped.

What is claimed is:

1. A television tuner comprising:

a VHF low-band tuning circuit which can be tuned to a television channel frequency in a VHF low-band;

a first amplification circuit amplifying an output signal from said VHF low-band tuning circuit;

a VHF high-band tuning circuit which can be tuned to a television channel frequency in a VHF high-band and which is provided independently from said VHF low-band tuning circuit;

a second amplification circuit amplifying an output signal from said VHF high-band tuning circuit;

a first damper resistor connected to said VHF low-band tuning circuit; and a second damper resistor connected to said VHF high-band tuning circuit;

wherein;

when said VHF low-band tuning circuit is tuned to a television channel frequency in a predetermined low-frequency band in said VHF low-band, including a lowest channel in said predetermined high-frequency band of said VHF low-band tuning circuit, said first damper resistor reduces a Q value of said VHF low-band tuning circuit; and when said VHF high-band tuning circuit is tuned to a television channel frequency in a predetermined high-frequency band in said VHF high band, including a lowest channel in said predetermined high-frequency band of said VHF high-band tuning circuit, said second damper resistor reduces a Q value of said VHF high-band tuning circuit.

2. A television tuner according to claim 1, comprising a channel-selection control circuit supplying a tuning voltage to said VHF low-band tuning circuit and said VHF high-band tuning circuit in accordance with a selected channel.

3. A television tuner according to claim 1, wherein:

said VHF low-band tuning circuit includes first and second coils, an end of the first coil connected with an end of the second coil, and first and second varactor diodes, an end of the first varactor diode connected with an end of the second varactor diode, with:

an input end of said VHF low-band tuning circuit connected to a point of connection between the first and second coils;

an opposing end of the first coil grounded;

an opposing end of the second coil connected to a point of connection between the first and second varactor diodes;

an end of a first switch diode connected to a point of connection between the opposing end of the second coil and the first and second varactor diodes; and said first damper resistor connected to an opposing end of said first switch diode; and said VHF high-band tuning circuit includes third and fourth coils, an end of the third coil connected with an end of the fourth coil, and third and fourth varactor diodes, an end of the third varactor diode connected with an end of the fourth varactor diode, with:

an input end of said VHF high-band tuning circuit connected to a point of connection between the third and fourth coils;

the third coil grounded;

an opposing end of the fourth coil connected to a point of connection between the third and fourth varactor diodes;

an end of a second switch diode connected to a point of connection between the opposing end of the fourth coil and the third and fourth varactor diodes; and an end of the second damper resistor connected to an opposing end of the second switch diode.

4. A television tuner according to claim 1, further comprising a channel-selection control circuit, said channel-selection control circuit supplying a tuning voltage to said VHF low-band tuning circuit and said VHF high-band tuning circuit in accordance with a selected channel, said channel-selection control circuit additionally generating a control voltage when said VHF low-band tuning circuit and said VHF high-band tuning circuit are tuned to a frequency in the predetermined low-frequency band;

wherein:

said VHF low-band tuning circuit includes first and second coils, an end of the first coil connected with an end of the second coil, and first and second varactor diodes, an end of the first varactor diode connected with an end of the second varactor diode, with:

an input end of said VHF low-band tuning circuit connected to a point of connection between the first and second coils;

an opposing end of the first coil grounded;

an opposing end of the second coil connected to a point of connection between the first and second varactor diodes;

an opposing end of the first varactor diode grounded by a first capacitor;

an opposing end of the second varactor diode connected to an input terminal of said first amplification circuit via a second capacitor;

an end of a first switch diode connected to a point of connection between the opposing end of the second coil and the first and second varactor diodes;

an end of the first damper resistor connected to an opposing end of the first switch diode; and an opposing end of the first damper resistor connected to a control terminal at which the control voltage from said channel-selection circuit is generated; and said VHF high-band tuning circuit includes third and fourth coils, an end of the third coil connected with an end of the fourth coil, and third and fourth varactor diodes, an end of the third varactor diode connected with an end of the fourth varactor diode, with:

an input end of said VHF high-band tuning circuit connected to a point of connection between the third and fourth coils;

the third coil grounded;

an opposing end of the fourth coil connected to a point of connection between the third and fourth varactor diodes;

an opposing end of the third varactor diode connected to an input terminal of the second amplification circuit via a fourth capacitor;

an end of a second switch diode connected to a point of connection between the opposing end of the fourth coil and the third and fourth varactor diodes;

an end of the second damper resistor connected to an opposing end of the second switch diode;

an opposing end of the second damper resistor connected to the control terminal at which the control voltage from the channel-selection control circuit is generated; and the first and second switch diodes set to be in conduction by the control voltage.

\* \* \* \* \*

UNITED STATES PATENT AND TRADEMARK OFFICE
CERTIFICATE OF CORRECTION

PATENT NO. : 6,108,050  
DATED : August 22, 2000  
INVENTOR(S) : Masaki Yamamoto et al.

Page 1 of 1

It is certified that error appears in the above-identified patent and that said Letters Patent is hereby corrected as shown below:

<u>Title page,</u>
Item [73], after line 2 insert the following:
-- Notice: This patent issued on a continued prosecution application filed under 37 CFR 1.53 (d), and is subject to the twenty year patent term provisions of 35 U.S.C. 154 (a) (2). --.

Signed and Sealed this

Sixteenth Day of April, 2002

*Attest:*

JAMES E. ROGAN
*Attesting Officer*     *Director of the United States Patent and Trademark Office*